US008791603B2

(12) United States Patent
 Landmann

(10) Patent No.: US 8,791,603 B2
(45) Date of Patent: Jul. 29, 2014

(54) TWO LEAD ELECTRONIC SWITCH SYSTEM ADAPTED TO REPLACE A MECHANICAL SWITCH SYSTEM

(71) Applicant: Kulite Semiconductor Products, Inc., Leonia, NJ (US)

(72) Inventor: Wolf S. Landmann, Fair Lawn, NJ (US)

(73) Assignee: Kulite Semiconductor Products, Inc., Leonia, NJ (US)

(*) Notice: Subject to any disclaimer, the term of this patent is extended or adjusted under 35 U.S.C. 154(b) by 0 days.

(21) Appl. No.: 13/874,666

(22) Filed: May 1, 2013

(65) Prior Publication Data
US 2013/0241614 A1    Sep. 19, 2013

Related U.S. Application Data

(63) Continuation of application No. 12/772,679, filed on May 3, 2010, now Pat. No. 8,482,162.

(51) Int. Cl.
| H01H 35/00 | (2006.01) |
| H03K 5/153 | (2006.01) |
| H01H 35/24 | (2006.01) |
| H01H 37/00 | (2006.01) |

(52) U.S. Cl.
CPC ............... *H03K 5/153* (2013.01); *H01H 35/24* (2013.01); *H01H 37/00* (2013.01)
USPC .......................... 307/119; 307/116; 327/189

(58) Field of Classification Search
CPC ........ H03K 5/153; H01H 35/24; H01H 37/00
USPC .......................................................... 307/119
See application file for complete search history.

(56) References Cited

U.S. PATENT DOCUMENTS

| 5,306,955 A * | 4/1994 | Fryer ............................. 307/116 |
| 7,034,700 B2 * | 4/2006 | Kurtz et al. ................... 340/626 |

* cited by examiner

*Primary Examiner* — Rexford Barnie
*Assistant Examiner* — Toan Vu
(74) *Attorney, Agent, or Firm* — Troutman Sanders LLP; James E. Schutz

(57) ABSTRACT

Systems and methods for a two lead electronic switch adapted to replace a mechanical switch are provided. In one embodiment, a method comprises, in an electronic switch having a sensor, an electronic circuit, a first terminal and a second terminal, receiving, by the electronic circuit, an output of the sensor proportional to a sensed amount; determining, by a comparator of the electronic circuit, that the output of the sensor is less than a threshold voltage; in response to determining, deactivating, by the comparator, a voltage limiting circuit of the electronic circuit to operate the electronic circuit in a first state; operating the electronic circuit in a second state when the output of the sensor is at least the threshold voltage; receiving, across the first terminal and the second terminal, a switch voltage used to provide power for the electronic switch; wherein the electronic switch sets the switch voltage to a first voltage level operative to power the electronic circuit and the sensor when the electronic circuit is operating in the first state; and wherein the electronic switch sets the switch voltage to a second voltage level operative to power the electronic circuit and the sensor when the electronic circuit is operating in the second state.

19 Claims, 3 Drawing Sheets

TWO LEAD ELECTRONIC SWITCH SYSTEM ADAPTED TO REPLACE A MECHANICAL SWITCH SYSTEM

CROSS REFERENCE TO RELATED APPLICATIONS

This application claims priority to U.S. Non-provisional patent application Ser. No. 12/772,679, filed May 3, 2010, the contents of which are hereby incorporated by reference as if fully set forth below.

BACKGROUND

Embodiments of the present invention relate to an electronic switch and, more particularly, to an electronic switch system adapted to replace a mechanical switch system.

Mechanical switches have been used in electromechanical devices for many years. Unfortunately, they have many shortcomings. For instance, mechanical switches are limited by their mechanical construction. Among other things, mechanical switches are known to provide poor reliability, poor stability, limited operational lifespan, relatively low accuracy, contact degradation, undefined hysteresis, and limited sensitivity to vibration shock, particularly when compared with electronic switches.

Unlike the mechanical construction of mechanical switches, electronic switches use solid-state technology and do not have the same restrictions or limitations that mechanical switches have. In many instances, electronic switches improve the limitations of mechanical switches, e.g., improving operational life, by several orders of magnitude. Advantageously, electronic switches can implement functions that cannot be implemented in mechanical switches, e.g., latched output(s), multiple thresholds, timed delays, and the like.

Today, there are numerous devices that utilize mechanical switches. Unfortunately, while it may be desirable to implement an electronic switch in the place of these mechanical switches, difficulties often forbid such replacement. For example, electronic switches may require a permanent power supply for the electronics and the sensor in the switch. In some instances, designers have supplied power via an additional wire to the electronic switch. Adding a power supply wire often requires rewiring the entire system in which the switches are part. Such rewiring is often expensive and difficult.

SUMMARY

Briefly described, embodiments of the present invention relate to an electronic switch adapted to replace a conventional mechanical switch. In some embodiments, the electronic switch can be used in certain applications as a direct replacement to a two-wire mechanical switch, without the need of additional wiring. For example, in an exemplary embodiment, the electronic switch is a plug-and-play replacement for the mechanical switch, such that no additional rewiring of a system implementing the switches is necessary.

The electronic switch can be pressure sensitive, wherein the state of the switch changes (opens or closes) when the pressure on the switch increases above or decreases below a certain threshold, or temperature sensitive, wherein the state of the switch changes (again, opens or closes) when the temperature rises above or decreases below a predetermined threshold.

In one aspect, an electronic switch can comprise a first terminal; a second terminal; an environmental condition sensor; and a switching element. The environmental condition sensor is configured to receive an input and provide an output. The switching element receives the output of the environmental condition sensor. The switching element is adapted to operate in a first state when a voltage at the first terminal is greater than a high threshold voltage, and adapted to operate in a second state when a voltage at the first terminal is within a low threshold range.

These and other objects, features, and advantages of the present invention will become more apparent upon reading the following specification in conjunction with the accompanying drawings.

DETAILED DESCRIPTION

To facilitate an understanding of the principles and features of the present invention, embodiments are explained hereinafter with reference to an implementation in an illustrative embodiment. In particular, embodiments of the present invention are described in the context of being an electronic switch. Embodiments of the present invention also relate to an electronic switch system adapted to replace a conventional mechanical switch.

The materials and components described hereinafter as making up the various elements of the present invention are intended to be illustrative and not restrictive. Many suitable materials and components that would perform the same or a similar function as the materials and components described herein are intended to be embraced with the scope of the present invention. For example, such other materials and components described herein can include, but are not limited to, materials and components that are developed after the time of the development of the present invention.

Referring now to the figures, wherein like references numerals represent like parts throughout the views, the electronic switch system will be described in detail.

Embodiments of the present invention relate to an electronic switch system 100. The electronic switch system 100 is adapted to replace a conventional mechanical switch 10. In some embodiments, the electronic switch system 100 can be used in certain applications as a direct replacement for a two-wire mechanical switch 10, without the need of additional wiring. For example, in an exemplary embodiment, the electronic switch system 100 can be a plug-and-play replacement for the mechanical switch 10, such that no additional rewiring of a system implementing the switches is necessary. In some embodiments, the circuit schematics of FIGS. 2-3 can replace the circuit schematic of FIG. 1 and such packaging may be used to facilitate ease of replacement.

The electronic switch system 100, among other things, can be a pressure sensitive switch, wherein the state of the switch changes (opens or closes) when the pressure on the switch increases above or decreases below a certain threshold, or temperature sensitive switch, wherein the state of the switch changes (again, opens or closes) when the temperature rises above or decreases below a predetermined threshold. Other switches can also be implemented as part of the electronic switch system.

Figure 1:
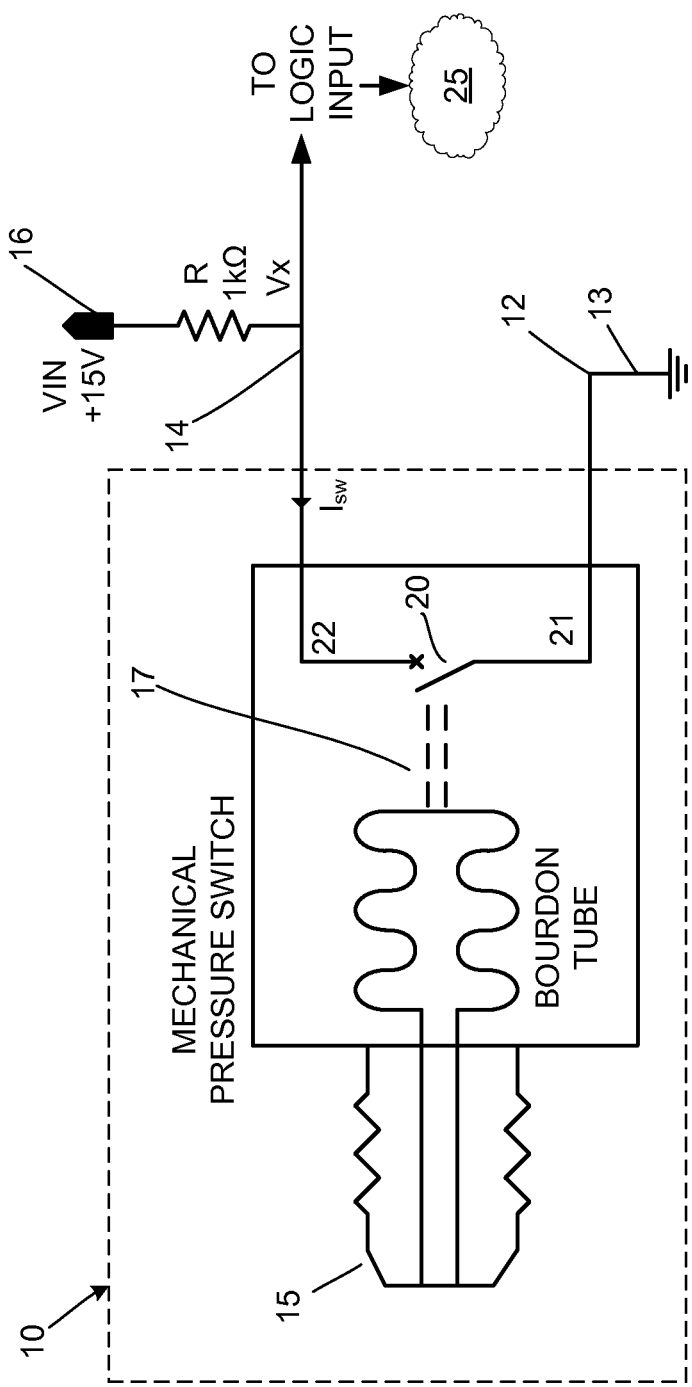
FIG. 1 is a schematic view of a conventional mechanical pressure switch connected by two leads to a circuit.

Traditional mechanical switches, such as that shown in FIG. 1, have two leads, an input and an output. When the switch is open, the input and output are disconnected or no current flows through the switch. When the switch is closed, the input and output are connected and current is allowed to flow through the switch.

Traditional electronic switches operate in a similar manner, except that power must always be fed to the switch so that the electronic sensor in the switch, which detects when a state change should occur, is active.

Accordingly, difficulties in replacing a mechanical switch with an electronic switch are abundant. A first exemplary challenge associated with replacing a two-wire mechanical switch with an electronic switch includes providing power to the electronic sensor while the switch is in an open state. In essence, because the electronic switch needs power to operate, replacing a mechanical switch with an electronic switch often requires rewiring a portion of a circuit to effectively make this change. Specifically, conventional electronic switches require a third terminal to constantly provide power.

FIG. 1 illustrates a circuit schematic of an exemplary conventional two-wire mechanical pressure switch 10. In operation, a pressure source is applied to the pressure port of a Bourdon tube mechanical pressure switch 15, which is adapted to expand or contract based on a function of pressure. Widely used, a Bourdon type pressure gage is an instrument in which pressure measurement is based on the deformation of an elastic measuring element. The Bourdon tube 15 has a coupling member 17 which is coupled to the actuator of a microswitch 20. In essence, the Bourdon tube can activate the microswitch 20 when its expansion is above a predetermined threshold, e.g., when there is a certain amount of pressure applied to the Bourdon tube.

In some mechanical switches, the Bourdon tube can be replaced by a flexible diaphragm that is exposed to pressure. In a mechanical temperature switch, the Bourdon tube can be replaced with, for example and not limitation, a bi-metallic actuator.

The microswitch 20 has a first terminal 21 connected to a first lead 12 of a circuit. In the circuit show in FIG. 1, the first terminal 21 is coupled to a ground signal 13. The microswitch 20 also has a second terminal 22 connected to a second lead 14 of the circuit. In the circuit shown in FIG. 1, the second terminal 22 is coupled to an input terminal that receives an input voltage (VIN) 16 through a pull-up resistor. Though not illustrated, in some embodiments, the terminal 14 can be coupled to another switch, relay, or device to inactivate or control the monitored pressure source.

When used in the circuit schematic of FIG. 1, the voltage to the logic input 25 is approximately zero when the microswitch 20 is in a closed state and approximately equal to the input voltage 16 when the microswitch 20 is in an open state. The change in voltage is used by the logic circuit 25 as an indication that the pressure is above or below the predetermined threshold.

In many situations, it may be desirable to replace a mechanical switch—due to its inherent limitations, including those described above and illustrated in FIG. 1—with an electronic switch. When this replacement is desired, it may be also desirable to make such a replacement without additional wiring to the overall system. Embodiments of the present invention relate to such improvements.

Figure 2:
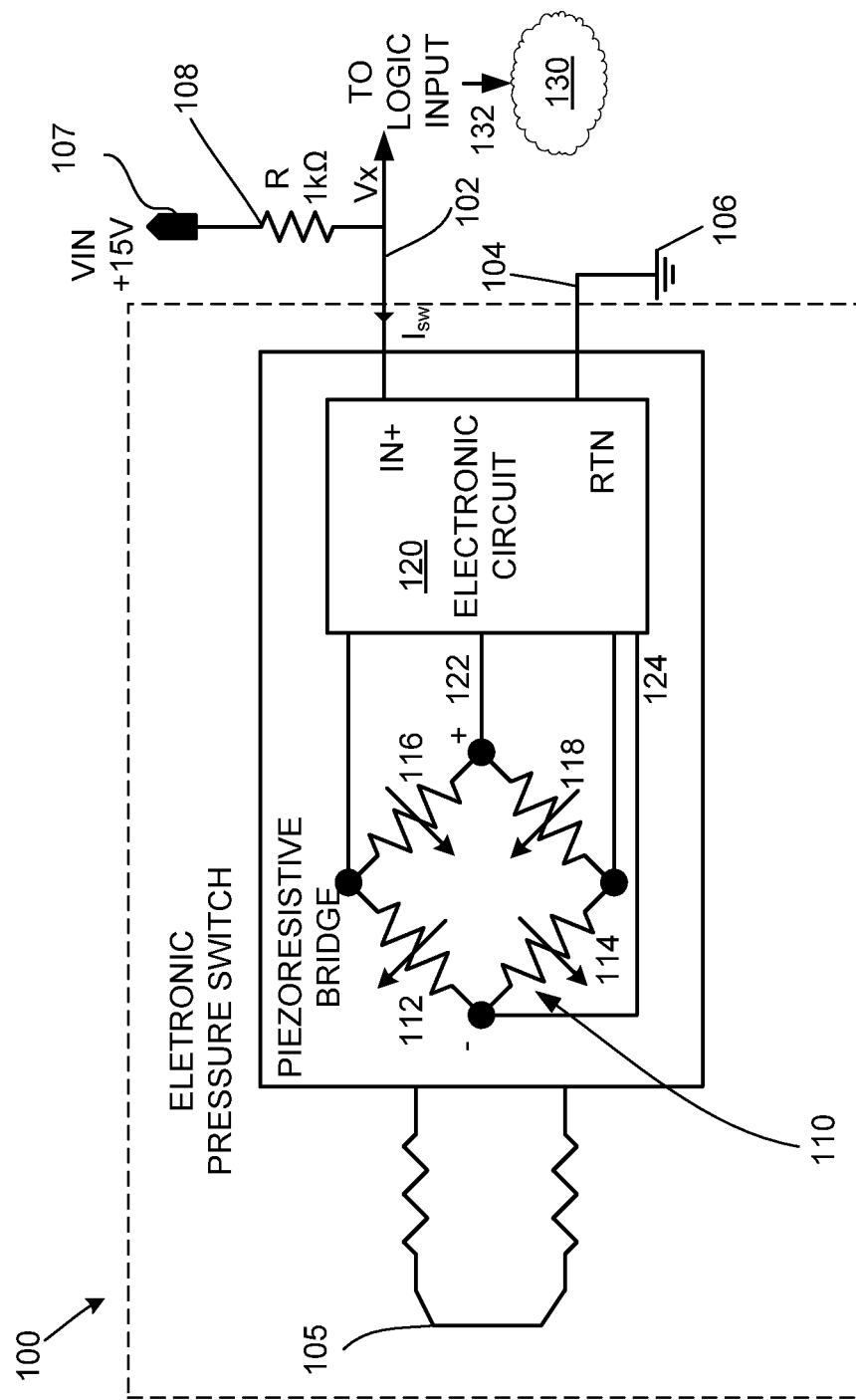
FIG. 2 is a schematic view of an electronic switch system connected by two leads to a circuit, in accordance with an exemplary embodiment of the present invention.

An exemplary electronic switch in accordance with embodiments of the present invention is illustrated in FIG. 2, which illustrates a circuit schematic of an electronic pressure switch system 100 that can be used to replace a conventional two-wire mechanical switch in the circuit shown in FIG. 1.

The electronic pressure switch system 100 of FIG. 2 comprises a connection assembly including two terminals 102 and 104, a pressure source 105, a bridge array 110, and an electronic circuit 120. The electronic circuit 120 of the electronic pressure switch 100 can be in communication with a logic input 132 of a logic circuit 130.

The pressure sensor 105, which in some embodiments can be a Bourdon tube, diaphragm, or like device, is adapted to receive a pressure applied to it. Depending on the pressure applied to the pressure sensor, the pressure sensor 105 can activate a switch that is incorporated in electronic circuit 120.

Figure 3:
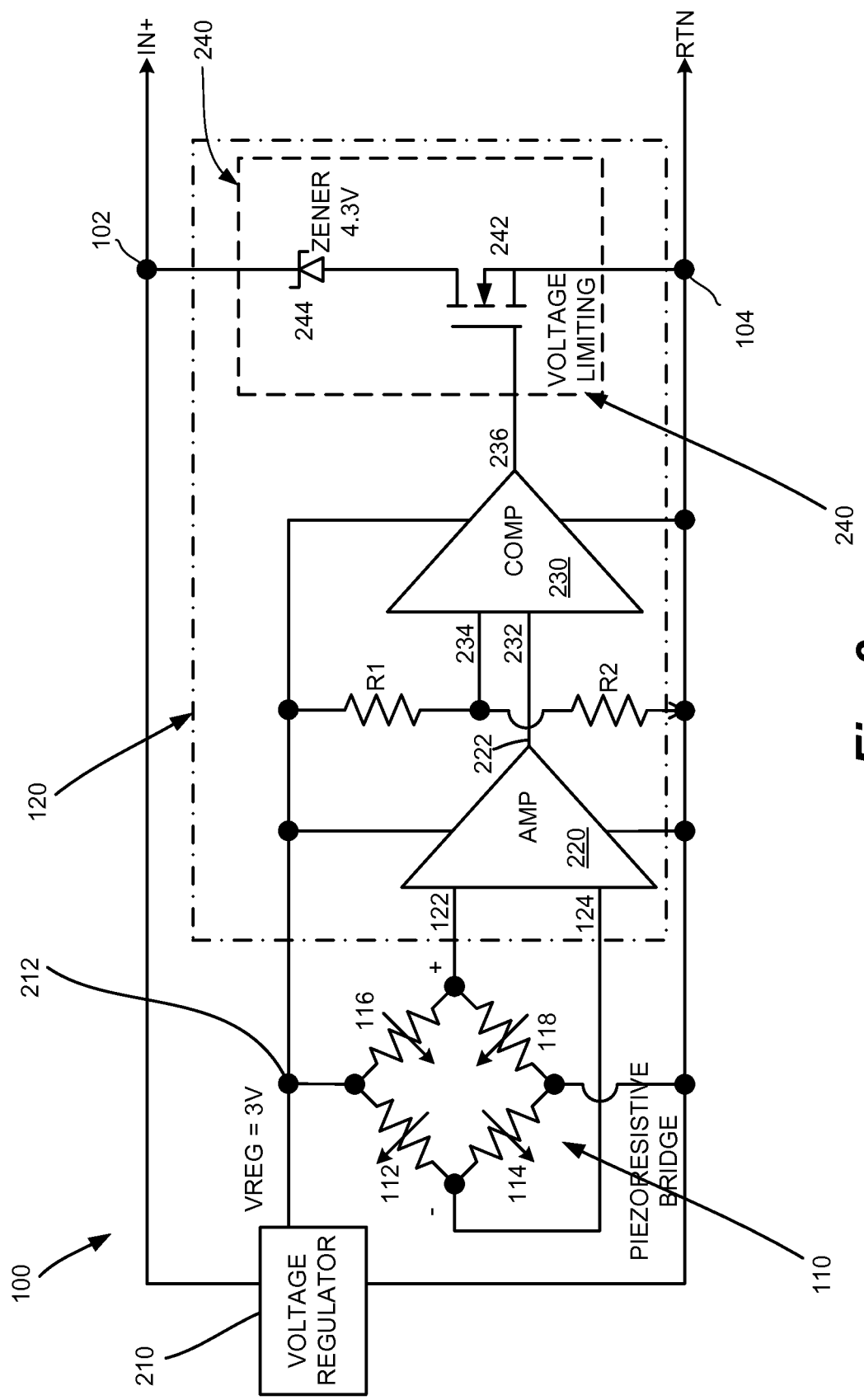
FIG. 3 is a schematic view of an exemplary implementation of the electronic switch system connected by two leads to a circuit, in accordance with an exemplary embodiment of the present invention.

The bridge array 110 can include four piezoresistors 112, 114, 116, and 118. In some embodiments, the bridge array 110 may include four piezoresistors arranged in a Wheatstone bridge configuration, as illustrated in FIGS. 2-3. The utilization of Wheatstone bridges employing semiconductor piezoresistors is well known and the assignee herein, namely Kulite Semiconductor Products, Inc. ("Kulite"), has many patents showing various configurations of piezoresistors employed in Wheatstone or other bridge arrays. See, for example, U.S. Pat. No. 6,210,989 entitled "Ultra Thin Surface Mount Wafer Sensor Structures and Methods For Fabricating Same" issued on 3 Apr. 2001, to Kurtz et al., which is incorporated herein as if fully set forth below. U.S. Pat. No. 6,210,989 identifies many other Kulite patents that also show piezoresistive sensors located in Wheatstone bridge configurations. Wheatstone bridges are well known in the art.

The bridge array 110, or piezoresistive bridge structure, can be a pressure sensitive structure. The pressure sensitive structure can have the four serpentine or tortuous piezoresistors 112, 114, 116, and 118, each of which can be composed of highly doped silicon. Each piezoresistor 112, 114, 116, and 118 can be a variable resistor in one of four legs of the Wheatstone bridge circuit, with each of the respective resistances varying in response to an applied force or pressure.

While four piezoresistors are illustrated, there can be two piezoresistors in one arm of the bridge and two fixed resistors in the other arm of the bridge for certain applications. The outputs of the bridge array (plus (+) and minus (−)) are directed to the inputs 122 and 124, respectively, of the electronic circuit 120. The electronic circuit 120 also supplies biasing to the bridge array as well as reference potential.

In operation, pressure can be applied to the electronic switch system 100 at its pressure sensor 105. As pressure is applied, the piezoresistive sensor changes in resistance and the output of the Wheatstone bridge changes.

The electronic circuit 120 is in communication with two terminals 102 and 104 of the a circuit to which the electronic switch system 100 be placed. In the sample circuit shown in FIGS. 2-3, a first terminal 102 is coupled to the logic input 132 of the logic circuit 130 and the second terminal 104 is coupled to a ground signal 106. The first terminal 102 is also in communication with the input voltage VIN 107, through a pull-up resistor R 108. In some embodiments, the resistor R 108 can have a resistance of approximately one kilo-Ohm (1 kΩ). In some embodiments, the input voltage (VIN) is about 15 volts (+15V). Other voltages, higher or lower than +15V, can be used in the circuit in which the electronic switch system 100 is in communication.

It is a common design technique that is well-known in the art to use a pull-up resistor R with semiconductor outputs.

The electronic switch system 100 can include an environmental sensor. The environmental sensor is configured to receive a change in condition. In some embodiments, the change in conduction can be an increase or decrease in pressure. In some embodiments, the change in condition can be an increase or decrease in temperature.

The electronic switch system 100 can further include a switching mechanism. The switching mechanism includes a first state and a second state. In some embodiments, the switching mechanism can be in the first state when the voltage on the first terminal is greater than a high threshold voltage. The switching mechanism can be in the second state when the voltage on the first terminal is within a low voltage range, for example and not limitation above zero volts and below a low threshold voltage.

In some embodiments, the electronic circuit 120 can include a normally open shunt relay as the switching mechanism. Depending on the amount of pressure or temperature, the switching mechanism can be open or closed. In an exemplary embodiment, the normally open shunt relay remains open, until a predetermined event occurs. For example, once a certain amount of pressure is applied to the piezoresistive bridge, the relay will close. Depending on the state of the relay, whether open or closed, the signal provided to the circuit will change.

In an exemplary embodiment, the logic circuit 130 interprets which of the two states the switching mechanism is in. For example, the logic circuit 130 recognizes a first state, or what can be referred to as a "CLOSED" state, of the switch mechanism when the input logic voltage Vx is within a low threshold range—greater than zero volts and less than a given low threshold voltage $V_L$. For example, the low threshold voltage $V_L$ may be approximately four to five volts (4-5V), if the input voltage is approximately 15V. On the other hand, the logic circuit 130 recognizes a second state, or what can be referred to as an "OPEN" state, when the input logic voltage Vx is higher than a high threshold voltage $V_H$. For example, the high threshold voltage $V_H$ can be approximately eleven volts (11V), for instance if the input voltage is approximately 15V.

The electronic switch system 100 can accomplish the same functionality as the mechanical switch, without the need of additional wiring to the system. Here, the electronic switch system 100 replaces the mechanical switch, while at the same time not needing additional wiring, because the system 100 tolerates characteristics of the switch that are less than that of an ideal switch. For example and not limitation, for an ideal switch in the CLOSED state, current will flow through the circuit in the system of FIG. 1, the voltage Vx is approximately zero. The electronic switch system 100, however, can operate and recognize when the voltage Vx is less than the low threshold voltage and above zero volts and is in the first state, which again can be referred to as CLOSED. In the OPEN state, the current through an ideal switch ($I_{SW}$) is approximately zero, which results in a voltage Vx equal to the input voltage in the system of FIG. 1. The electronic switch system 100 operates in the second state, which again can be referred to as OPEN, when the voltage is higher than a high threshold voltage $V_H$, which can be accomplished as along as the current through the switch is less than a given threshold, for example and not limitation the given threshold current $I_L$ can be approximately 4 mA if the input voltage is approximately 15V. When discussing the OPEN and CLOSED states of the electronic switch, one skilled in the art will appreciate that these states are based on the performance of the switch when generally compared to an ideal switch.

In an exemplary embodiment using a circuit with an input voltage of about 15V, the specifications of the electronic switch system 100 can include: (1) Operation in an OPEN state: $I_{SW} < I_L = 4$ mA for voltages across the switch less than 32V; and (2) Operation in a CLOSED state: $Vx < V_L = 5V$ for currents through the switch less than 20 mA. These exemplary specifications permit the design of an electronic circuit that can be supplied with power without the need of an additional wire (e.g., a power wire) to the electronic switch system.

Depending on the input voltage and the electronics used in the system, the high threshold voltage and the low threshold voltage may be different. For example and not limitation, if the input voltage is approximately 15V, the low threshold voltage may be approximately 5V and the high threshold voltage may be approximately 11V; if the input voltage is approximately 12V, the low threshold voltage may be approximately 3.5V and the high threshold voltage may be approximately 9V; and if the input voltage is approximately 5V, then the low threshold voltage may be approximately 2V and the high threshold voltage may be approximately 3.5V. Depending on the needs of the system and the electronics used in the system the high and low thresholds may vary. In addition, the input voltage may be based on a design choice to the overall system.

FIG. 3 illustrates a circuit schematic of an exemplary embodiment for implementing an electronic switch system 100. As noted above, the electronic switch system 100 operates on two terminals connected to the circuit. In addition, the electronic switch system 100 can be designed wherein the total current consumption of the electronics and the sensor is less than about a given threshold current, e.g., $I_L$ is about 4 mA with an input voltage of approximately 15V, but could be different depending on the application, as well as the input voltage. If the pressure relative to the switching threshold is such that the switching mechanism should be in a CLOSED state, an additional voltage limiting circuit can be activated that can limit the voltage to less than the low threshold voltage $V_L$. In a practical implementation, this limit can be selected to be approximately 4.3 V±5%, which is less than the a low threshold voltage $V_L$ of about 5V, while high enough to keep the circuit operating properly.

For example and not limitation, in an exemplary embodiment the input voltage can be approximately 15V. A pull-up resistor R coupled to the input voltage VIN can be approximately 1 kΩ. The current consumption of the system 100 can be approximately 4 mA. The voltage drop across the resistor can be approximately 4V, i.e., V=iR, wherein V=4 mA*1 kΩ=4V, wherein the resulting voltage on the first terminal is approximately 11V, i.e., 15V−4V=11V.

The electronic switch system 100 of FIG. 3 includes a connection assembly that comprises two terminals 102 and 104, a voltage regulator 210, a bridge array 110, and the electronic circuit 120. The electronic circuit 120 comprises an amplifier 220, a comparator 230, and a voltage limiting circuit 240. Like before, this electronic switch system 100 includes a pair of terminals 102 and 104, which enables easy plug-and-play performance for replacing a two-terminal mechanical switch.

The voltage regulator 210 can be a low drop-out, low quiescent current regulator. For example and not limitation, when the input voltage VIN is approximately 15V, the voltage output 212 of the regulator (VREG) 210 can be approximately three volts (+3V). In such embodiments, the voltage of VREG can be approximately three volts (+3V) when the input voltage is between approximately four volts (+4V) and approximately thirty-two volts (+32V). In operation, regulated voltage supplies the bridge array 110, which can be a piezoresistive bridge, as well as the electronic circuit 120.

The bridge array 110, which is described in detail above, can generate an output of about a few tens of millivolts as a function of the pressure applied to the pressure sensor. The bridge outputs 122 and 124 (i.e., plus (+) and minus (−)) and the output 212 voltage regulator 210 are coupled to the electronic circuit 120.

The bridge outputs 122 and 124 can be coupled to an instrumentation amplifier (AMP) 220. In some embodiments, for example and not limitation when the input voltage is approximately 15V, the AMP 220 can generate an output of about two volts (2V), which can vary linearly as a function of the pressure applied to the pressure sensor. The output 222 of the AMP 220 can be coupled to a first input 232 of a comparator (COMP) 230. A second input 234 of the COMP 230 can be coupled to a resistive divider of resistors R1 and R2. The value of the resistors R1 and R2 are selected based on the output of this divider corresponding to the output 222 of the AMP 220 when the pressure is equal to the threshold pressure.

The resistive divider can include at least two resistors. The first resistor R1 is coupled at a first end to the output 212 of the voltage regulator 210 and at a second end to the second input 234 of the COMP 230. The second resistor R2 is coupled at a first end to the second input 234 of the COMP 230 and to the second wire 104.

The input polarity of the COMP 230 is selected based on the actual pressure relative to the threshold pressure is such that if the switch mechanism is CLOSED, then the output of the COMP 230 is set to high. The output 236 of the COMP 230 is coupled to the voltage limiting circuit 240.

This output 236 can turn on the MOSFET 242 of the voltage limiting circuit 240, which through the Zener diode 244 can limit the input voltage, for example in some embodiments to about 4.3V regardless of the current flowing through the switch mechanism.

Assuming the resistance of the bridge array 110 is more than about one kilo-Ohm (1 kΩ), the bridge current consumption can be less than about three milliAmps (3 mA). Assuming also that the quiescent current consumption of the voltage regulator VREG 210 plus the supply current of the AMP 220 and the COMP 230 can be less than 1 mA, the result is a total current consumption of the system 100 in the OPEN state of less than about 4 mA. This can satisfy the OPEN state condition for the switch.

On the other hand, in the CLOSED state, regardless of the current from the power supply, the voltage across the electronic switch system 100 can be limited by the Zener diode 244 to, for example about +4.3V, i.e., less than the limit the low threshold voltage $V_L$ to about +5V. This can satisfy the CLOSED state condition for the switch.

An advantage of the electronic switch system of the present invention is a portion of the input voltage is configured to drive or power the electronic switch system, thus not requiring the dedicated power terminal, and maintaining a two terminal circuit.

Depending on the input voltage, the voltages that trigger the change of state of the electronic switch can vary. Also, depending on the size of the resistor R that is coupled to the input voltage, the voltage that trigger the change of state of the electronic switch can vary. In some embodiments, the threshold can be set by the resistor divider and thus the values selected for resistors R1 and R2.

The electronic switch system 100 of the present invention can be used as a solid state electronic replacement of a mechanical switch, without any additional wiring or other changes in the existing wiring of the system. In some embodiments, instead of a pressure switch, a temperature switch is needed/desired. In such embodiments, instead of including a piezoresistive bridge, a temperature sensor can be used.

In one aspect, an electronic switch can comprise a first terminal; a second terminal; an environmental condition sensor; and a switching element. The environmental condition sensor is configured to receive an input and provide an output. The switching element receives the output of the environmental condition sensor. The switching element is adapted to operate in a first state when a voltage on the first terminal is greater than a high threshold voltage, and adapted to operate in a second state when a voltage on the first terminal is within a low threshold range.

The first terminal is adapted to receive an input voltage, wherein the input voltage provides sufficient power for the electronic switch to operate absent a dedicated power terminal.

The output of the environmental condition sensor is adapted to control the voltage on the first terminal.

The low threshold range is greater than zero volts and less than a low threshold voltage. In some embodiments, the first terminal is adapted to receive an input voltage, wherein the input voltage is approximately 15V, and wherein the low threshold voltage is approximately 4V and the high voltage threshold is approximately 11V. In some embodiments, the first terminal is adapted to receive an input voltage, wherein the input voltage is approximately 12V, and wherein the low threshold voltage is approximately 9V and the high voltage threshold is approximately 3.5V. In some embodiments, the first terminal is adapted to receive an input voltage, wherein the input voltage is approximately 5V, and wherein the low threshold voltage is approximately 3.5V and the high voltage threshold is approximately 2V.

The environmental condition sensor can comprise a bridge array having a sensing element and configured to provide the output proportional to a sensed amount. The sensed amount may be a predetermined pressure or a predetermined temperature applied to the sensing element. The switching element is coupled to the output of the bridge array and adapted to toggle between the first state and the second state depending on the output of the bridge array. In some embodiments, the bridge array can comprise a piezoresistive bridge. In some embodiments, the bridge array can comprise a Wheatstone bridge.

In another aspect, an electronic switch comprises a first terminal adapted to receive an input voltage; a second terminal; a bridge array comprising sensing elements, the bridge array providing an output proportional to a sensed amount; and an electronic circuit coupled to the output of the bridge array, the electronic circuit comprising a switching mechanism adapted to toggle between a first state and a second state depending on the output of the bridge array and the voltage on the first terminal, wherein the electronic switch operates absent a dedicated power source, and wherein the first and second terminals are the sole electronic connections from the electronic switch to a circuit system.

The switching mechanism is in the first state when a voltage on the first terminal is above a high threshold voltage.

The switching mechanism is in the second state when a voltage on the first terminal is within a low threshold voltage range. The low threshold voltage range is greater than zero volts and less than a low threshold voltage.

In some embodiments, the bridge array can comprise a piezoresistive bridge. In some embodiments, the bridge array can comprise a Wheatstone bridge.

The sensed amount of the bridge array can be a predetermined pressure or a predetermined temperature applied to the sensing element.

The switching mechanism is in the first state when a voltage on the first terminal is above a high threshold voltage and the switching mechanism is in the second state when the voltage is less than a low threshold voltage and greater than zero volts, and wherein: if the input voltage is approximately 15V: the low threshold voltage is approximately 4V, and the high voltage threshold is approximately 11V; if the input voltage is approximately 12V: the low threshold voltage is approximately 9V; and the high voltage threshold is approximately 3.5V; or if the input voltage is approximately 5V: the low threshold voltage is approximately 3.5V; and the high voltage threshold is approximately 2V.

While the invention has been disclosed in its preferred forms, it will be apparent to those skilled in the art that many modifications, additions, and deletions can be made therein without departing from the spirit and scope of the invention and its equivalents, as set forth in the following claims.

What is claimed is:

1. A method, comprising:
   in an electronic switch having a sensor, an electronic circuit, a first terminal and a second terminal, receiving, by the electronic circuit, an output of the sensor proportional to a sensed amount;
   determining, by a comparator of the electronic circuit, that the output of the sensor is less than a threshold voltage;
   in response to determining, deactivating, by the comparator, a voltage limiting circuit of the electronic circuit to operate the electronic circuit in a first state;
   operating the electronic circuit in a second state when the output of the sensor is at least the threshold voltage;
   receiving, across the first terminal and the second terminal, a switch voltage used to provide power for the electronic switch;
   wherein the electronic switch sets the switch voltage to a first voltage level operative to power the electronic circuit and the sensor when the electronic circuit is operating in the first state; and
   wherein the electronic switch sets the switch voltage to a second voltage level operative to power the electronic circuit and the sensor when the electronic circuit is operating in the second state.

2. The method of claim 1, wherein the first terminal and the second terminal are the only electronic connections from the electronic switch.

3. The method of claim 1, wherein the first voltage level is greater than the second voltage level.

4. The method of claim 1, wherein the second voltage level is associated with a voltage across the voltage limiting circuit of the electronic circuit.

5. The method of claim 1, wherein the sensor is used to measure a pressure.

6. The method of claim 1, wherein the sensor is used to measure a temperature.

7. The method of claim 1, wherein the sensor includes a bridge array having a sensing element.

8. The method of claim 7, wherein the output of the bridge array is coupled to the input of the electronic circuit, wherein the electronic circuit is configured to toggle between the first state and the second state based on the output of the bridge array.

9. The method of claim 7, the bridge array includes a Wheatstone bridge.

10. The method of claim 7, the bridge array includes a piezoresistive bridge.

11. The method of claim 1, wherein the threshold voltage is associated with a predetermined pressure.

12. The method of claim 1, wherein the threshold voltage is associated with a predetermined temperature.

13. The method of claim 1, further comprising:
    regulating, by a voltage regulator of the electronic switch, the switch voltage to supply a regulated voltage to the sensor.

14. The method of claim 1, wherein the voltage limiting circuit includes a switch in series with a Zener diode; and
    wherein deactivating the voltage limiting circuit includes placing the switch in an inactive state to deactivate the Zener diode.

15. The method of claim 1, further comprising:
    prior to input to the comparator, amplifying, by an amplifier of the electronic circuit, the output of the sensor.

16. The method of claim 1, wherein operating the electronic circuit in the second state includes:
    determining, by the comparator of the electronic circuit, that the output of the sensor is at least the threshold voltage; and
    in response to determining, activating, by the comparator, the voltage limiting circuit of the electronic circuit.

17. The method of claim 16, wherein the voltage limiting circuit includes a switch in series with a Zener diode; and
    wherein activating the voltage limiting circuit includes placing the switch in an active state to activate the Zener diode.

18. The method of claim 16, further comprising:
    prior to input to the comparator, amplifying, by an amplifier of the electronic circuit, the output of the sensor.

19. The method of claim 1, further comprising:
    wherein the current used by the electronic switch is greater for the electronic switch operating in the second state than in the first state.

* * * * *